United States Patent [19]
Claverie et al.

[11] Patent Number: 5,889,605
[45] Date of Patent: Mar. 30, 1999

[54] DETECTION DEVICE INCLUDING MEANS FOR AUTOMATICALLY SLAVING THE SENSITIVITY OF A PIN PHOTODIODE

[75] Inventors: Claude Claverie, Rennes; Daniel Boisseau, Liffre, both of France

[73] Assignee: Thomson Broadcast Systems, Cergy Pontoise Cedex, France

[21] Appl. No.: 773,908

[22] Filed: Dec. 27, 1996

[30] Foreign Application Priority Data

Dec. 29, 1995 [FR] France .................................. 95 15744

[51] Int. Cl.⁶ .................................................. H04B 10/06
[52] U.S. Cl. ......................... 359/189; 359/161; 359/194
[58] Field of Search .................................... 359/161, 195, 359/194, 189

[56] References Cited

U.S. PATENT DOCUMENTS

| | | | |
|---|---|---|---|
| 5,410,282 | 4/1995 | Larrick et al. | 330/149 |
| 5,734,300 | 3/1998 | Yoder | 330/308 |

FOREIGN PATENT DOCUMENTS

| | | |
|---|---|---|
| 0 402 044 | 12/1990 | European Pat. Off. . |
| 2 527 027 | 1/1983 | France . |
| 28 41 940 | 4/1980 | Germany . |
| 35 43 677 | 6/1987 | Germany . |
| A-59-230307 | 12/1984 | Japan . |
| 2 135 551 | 8/1984 | United Kingdom . |
| 2 181 832 | 4/1987 | United Kingdom . |
| 2 194 406 | 3/1988 | United Kingdom . |

OTHER PUBLICATIONS

Jerald Graeme, et al. "Circuit Options Boost Photodiode Bandwidth", Electrical Design News, (pp. 155–162), May, 1992.

*Primary Examiner*—Leslie Pascal
*Attorney, Agent, or Firm*—Oblon, Spivak, McClelland, Maier & Neustadt, P.C.

[57] ABSTRACT

In a detector for detecting a frequency-modulated light wave including a PIN photodiode (2), biasing means (11, 12, 15) are introduced which are capable of automatically forward biasing or reverse biasing the PIN photodiode (2) depending on the received light power. The output voltage of a transimpedance preamplifier stage (6) receiving the signal from the PIN photodiode (2) is thus automatically limited to a value below the saturation threshold of this transimpedance preamplifier stage (6).

4 Claims, 3 Drawing Sheets

DETECTION DEVICE INCLUDING MEANS FOR AUTOMATICALLY SLAVING THE SENSITIVITY OF A PIN PHOTODIODE

BACKGROUND OF THE INVENTION

Field of the Invention

The invention relates to the field of devices for converting an optical quantity into an electrical quantity.

In devices transmitting a video signal, for example a television signal, by optical means, for example by means of an optical fibre, there is, at one end of the optical fibre, or generally of the light channel in which the signal-carrying optical wave propagates, a converter which converts an optical quantity, for example optical energy, into an electrical quantity, for example a voltage or a current. The invention is applicable to the case in which this converter is a PIN photodiode.

A PIN photodiode is equivalent, when it is suitably biased by virtue of a positive voltage applied between its cathode (N junction) and its anode (P junction), to a current generator delivering a current i(t) expressed by the equation:

$$i(t) = S\ P(t).$$

In this equation, i(t) is the instantaneous strength of the current,

S is the sensitivity of the PIN photodiode expressed sed in amps per watt,

P(t) is the value of the instantaneous optical power received by the PIN photodiode.

Since the incident optical power generally varies from a low value to a very low value, the same applies to the value of the photodetected current and it may be imagined that it is necessary to amplify the latter extremely carefully. Such quality of amplification is achieved by making use of a so-called transimpedance-type preamplifier stage obtained by wiring up a resistor Rg between the output and the e(−) input of an amplifier of gain Gv having quite exceptional characteristics: A gain-bandwidth product greater than several tens of GHz in many applications.

A known embodiment of such a photodetection stage is depicted in FIG. 1.

This figure shows one end 1 of an optical fibre transmitting a light wave modulated by a video-frequency signal. The modulated light energy is received by a PIN photodiode 2 which includes an anode (P junction) 3, an intrinsic region 4 and a cathode 5. The PIN photodiode 2 is, in a known manner, reverse-biased, that is to say that a positive voltage is applied to its cathode 5. Under these conditions, the PIN photodiode 2 delivers a current which flows from its cathode 5 to its anode 3. This current is proportional to the value of the incident optical power. The proportionality ratio represents the sensitivity of the PIN photodiode 2.

FIG. 2 shows curves representing the value of the photodetected current $I_{ph}$ as a function of the reverse-bias voltage $V_p$. Each of the curves C1 ... C5 in FIG. 2 is the curve representing the value of the photodetected current for a constant photoelectric power as a function of the bias voltage. When this power varies and when the PIN photodiode 2 is biased, for example by a value $V_{po}$, the operating point of the PIN photodiode 2 is shifted along a vertical line portrayed in FIG. 2 by a dotted line passing through the $V_{po}$ value and parallel to the $I_{ph}$ axis representing the currents as a function of the incident power.

The current $I_{ph}$ is amplified by a transimpedance preamplifier stage 6 having a negative input 7, a positive input 8, an output 9 and a feedback resistor Rg 10 connected between the output 9 and the negative input 7.

It is known that the value of the noise current ieff (Rg) due to Rg, appearing on the e(−) input 7 of the transimpedance preamplifier stage 6, is given by the equation:

$$ieff(Rg) = \frac{\alpha}{[Rg]^{1/2}}.$$

It is easy to imagine the advantage of being able, for signal-to-noise ratio reasons, to use a high to very high value of the feedback resist or Rg.

Due to the feedback phenomenon to which the resistor Rg 10 is subjected, the apparent value of the feedback resistor Rg 10 seen by the PIN photodiode 2 is extremely low.

This apparent resistance Rapp is expressed by the equation:

$$Rapp = \frac{Rg}{G+1}.$$

In this equation, G is the gain of the transimpedance preamplifier stage 6.

The negative input 7 is thus equivalent to a virtual earth and all the current i(t) is diverted to the feedback resistor Rg 10. Thus, the output voltage $V_s(t)$ is of the form:

$$V_s(t) = i(t)Rg = S\ P_h(t)Rg.$$

If the average incident optical power $P_h(t)$ reaches a very high value, which would be the case for example for a detector stage located at one end of a very short optical fibre, between emitter and receiver, or else at a very short distance from a repeater, the value of $V_s(t) = S\ P_h(t)\ Rg$ may reach a very high value. Under these conditions, the transimpedance preamplifier stage 6 saturates and no longer operates in a linear fashion.

This problem of saturation of the transimpedance preamplifier stage 6 is known and various solutions have been used to remedy it.

A first known embodiment aimed at avoiding the saturation of the transimpedance preamplifier stage 6 consists in using a feedback resistor Rg 10 of low value in such a way that $V_s(t)max = i(t)max\ Rg$ does not exceed the maximum permissible $V_s$ value. This solution is offset by a deterioration in the intrinsic signal-to-noise ratio of the optical receiver because of the increase in the term $$ieff(Rg) = \frac{\alpha}{[Rg]^{1/2}}.$$

In this expression, α is a coefficient of proportionality.

A second known embodiment aimed at avoiding the saturation of the transimpedance preamplifier stage 6 consists in inserting an attenuator in the optical link in order to prevent P(t) from exceeding the maximum permissible value P(t) maximum. This individual optimization constraint for each link is currently no longer accepted by users.

This embodiment requires the latter to measure or calculate the average incident optical power in order to determine the value of the attenuator to be inserted.

Finally, a third known solution consists in replacing the PIN photodiode 2 with an avalanche photodiode. An avalanche photodiode is equivalent to a PIN photodiode which would be characterized by a sensitivity:

$S_1 = M\ S$,

S being the sensitivity of a conventional PIN photodiode,

M being a coefficient lying between 1 and ≅20. The value of the multiplication factor M is a function of the value of the bias voltage of the avalanche photodiode. By exploiting this property, it is possible by virtue of an electrical feedback loop to slave the value of M to the value of the optical power incident on the photodetector stage.

This effective solution has the drawback of being extremely expensive because, on the one hand, of the cost of an avalanche diode compared to the cost of a PIN photodiode and, on the other hand, of the cost of the electronic circuits for slaving the avalanche diode.

The purpose of the present invention is to provide a transimpedance preamplifier stage using a PIN detection photodiode whose average output current remains below the current causing saturation of the transimpedance preamplifier stage, this being so without decreasing the value of the signal/noise ratio of this transimpedance preamplifier stage. By this is meant that, for the same theoretical signal/noise ratio value, the incident-light power dynamics of the device according to the invention are superior to those of PIN photodiode devices according to the prior art. Put another way, for the same feedback resistor Rg of the transimpedance preamplifier stage, the light-power reception dynamics of the device according to the invention are superior to those of PIN photodiode devices of the prior art.

Thus, the device according to the invention may be employed, without any special precautions or adjustments, at one end of an optical fibre whose other end receives light power from an emitter, or from a repeater, this being the case virtually whatever the distance between the emitter or the repeater and the device according to the invention. In particular, it will no longer be necessary, as in the first embodiment of the prior art, to adjust the value of the feedback resistor RG, in order to decrease it when the distance from the source decreases, thereby paradoxically increasing the noise of the stage and therefore decreasing the signal/noise ratio. It will not be necessary either, as in the second embodiment of the prior art, to decrease the received light power by means of an attenuator when the average light power received by the PIN photodiode increases, for example because of the shortness of the optical line between the final repeater and the device according to the invention.

In short, the use of the PIN photodiode photodetector device according to the invention relieves the user of any worries about matching the device to the average level of the optical power received locally. The matching takes place automatically.

In order to maintain the average value of the modulation current photodetected by the PIN photodiode, provision is made according to the present invention to decrease the sensitivity of the PIN photodiode above a certain threshold of average received light power, $P_h$threshold.

Above this threshold $P_h$threshold the average current generated by the PIN photodiode remains constant.

The invention therefore relates to a device for detecting a signal carried by a modulated light wave, the device receiving the wave on a PIN photodiode having two electrodes, an anode and a cathode, as well as an intrinsic part, at least one of the electrodes of the PIN photodiode being connected to biasing means, the PIN photodiode delivering, when it is reverse-biased by a positive voltage applied between its cathode and its anode, a photodetection current i(t) proportional to the power of the incident light wave, which detection device is characterized in that the means for biasing the PIN photodiode are capable of applying two bias states to the PIN photodiode, a first bias state and a second bias state, the bias being automatically established in the first or in the second state depending on the average received light power; in the first state, corresponding to average received light powers below a threshold value $P_h$threshold, the photodiode is reverse-biased by the biasing means; in the second state, corresponding to average received light powers greater than the threshold value $P_h$threshold, the photodiode is forward-biased by the said biasing means, the average photodetection current delivered by the photodiode then being constant.

A preferred embodiment together with other embodiments of the invention will now be described below in relation to the appended drawings in which:

FIG. 1, already described, represents a PIN photodiode for detecting a light signal, which photodiode is connected between a reverse-bias supply and a transimpedance preamplifier stage in accordance with the prior art;

In the various figures, the elements having the same function bear the same reference number. In particular in FIG. 3, which will be described hereinbelow, the elements having the same function as those in FIG. 1 bear the same reference number.

Figure 3:
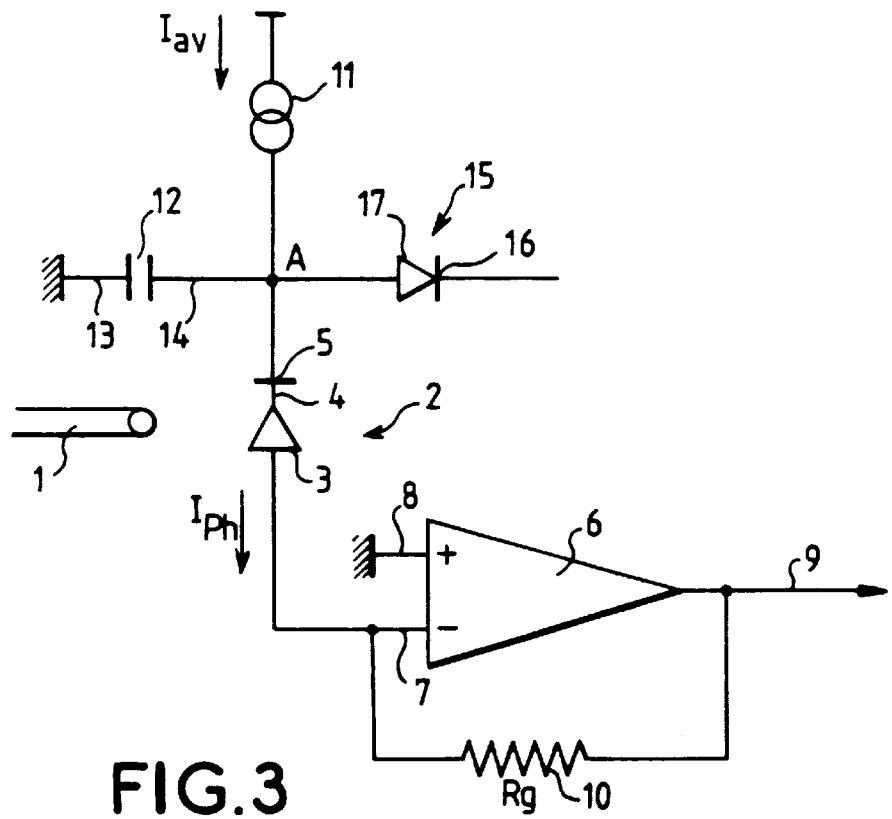
FIG. 3 represents a PIN photodiode equipped with biasing means according to a preferred embodiment of the invention, as well as the transimpedance preamplifier stage to which it is coupled.

Thus, in FIG. 3, a PIN photodiode 2, which includes an anode 3, an intrinsic region 4 and a cathode 5, is supplied by a modulated light source, shown diagrammatically in this embodiment by one end 1 of an optical fibre. The anode 3 of the photodiode 2 is connected to a negative input of a transimpedance preamplifier stage 6. The positive input of this transimpedance preamplifier stage 6 is, in this example, connected to earth. A feedback resistor Rg 10 is connected between the output 9 of the transimpedance preamplifier stage 6 and the negative input 7.

According to a preferred embodiment of the invention, biasing means are connected, for example to a point A, to the cathode 5 of the PIN photodiode 2. In the example shown, these means comprise, connected to the point A, a constant-current generator 11, a capacitor 12 having two connections 13 and 14, one 14 of which is connected to the point A, and a diode 15 having a cathode 16 and an anode 17. The anode 17 of the diode 15 is connected to the point A. Thus, the constant-current generator 11, the anode 17 of the diode 15 and a connection 14 of the capacitor 12 are connected to the point A to the cathode 5 of the PIN photodiode 2. The means 11, 12 and 15 constitute, in this embodiment, the means for biasing the PIN photodiode 2.

Figure 4:
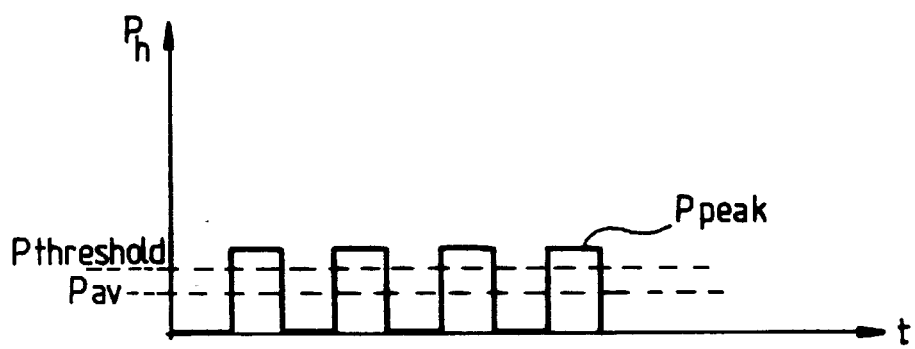
FIGS. 4 and 5 are curves each representing, as a function of time, an intentionally very simple example of light power received.
Figure 5:
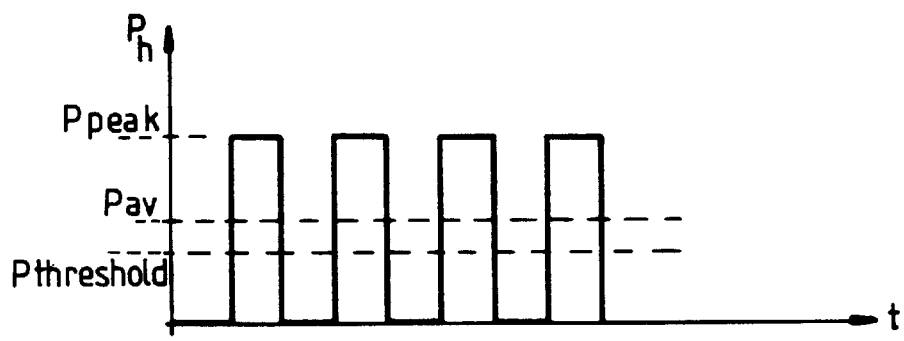

The operation of these means will now be explained with reference to FIGS. 2, 3, 4 and 5. FIGS. 4 and 5 are curves each representing, as a function of time, a light power incident on the PIN photodiode 2. These curves consist of a succession of zero and then positive powers following each other alternately over equal periods. In FIG. 4, the positive level $P_h$peak is such that the average received power is below a threshold power $P_h$threshold which is determined in a known manner from the saturation voltage of the transimpedance preamplifier stage 6. This case, which corresponds to the case in which the emitting source is relatively far from the PIN photodiode 2, corresponds to the first bias state of the device according to the invention. In FIG. 5, the positive level $P_h$peak is such that the average received power is above a threshold power $P_h$threshold determined in a known manner from the saturation voltage of the transimpedance preamplifier stage 6. This case, which corresponds to the case in which the emitting source lies relatively close to the PIN photodiode 2, corresponds to the second bias state of the device according to the invention. Of course, since the same transimpedance preamplifier stage 6 is involved in both cases, the average light power which induces an output voltage saturating the transimpedance preamplifier stage 6 is the same. Likewise, in both cases, which are intentionally chosen to be simple for teaching purposes, the average received power is equal to half the peak value of the received light power.

In FIGS. 4 and 5, the average received power is portrayed by a dotted line, parallel to the time axis and lying at the $P_{av}$ level. The $P_{av}$ level is half the value of the $P_h$peak level. The $P_h$threshold level is also represented by a dotted line parallel to the time axis. In FIG. 4, the $P_{av}$ level is below the $P_h$threshold level. It is the other way round in FIG. 5.

It will now be explained how the device according to the invention, shown in FIG. 3, behaves when the average incident light power is below the threshold power $P_h$threshold (the situation in FIG. 4). Firstly, it will be noted that the constant-current generator 11 delivers a preprogrammed current $I_{av}$ flowing from the constant-current generator 11 to the point A. The current $I_{av}$ is such that a voltage at the terminals of the feedback resistor Rg 10, having the value $I_{av} \times Rg$, is below the saturation voltage of the transimpedance preamplifier stage 6.

When the current source is connected, the capacitor 12, in a transient phase, first of all charges. The potential at the point A increases. When this potential is sufficient to turn the diode 15 on, the capacitor 12 stops charging. The current $I_{av}$ is diverted to the diode 15 which is conducting. The PIN photodiode 2 is reverse-biased, that is to say that a positive voltage is applied to its cathode 5. The bias point is, for example, at the value $V_{po}$ plotted on the abscissa axis in FIG. 2. When a light power is applied to the PIN photodiode 2, a current is established between the cathode 5 and the anode 3 of the PIN photodiode 2, i.e. said current is called I–$I_{ph}$. Since the current generator 11 is constant, it therefore sends a current $I_{av}$–$I_{ph}$ through the diode 15.

The voltage at the point A remains equal to $V_{po}$.

Figure 1:
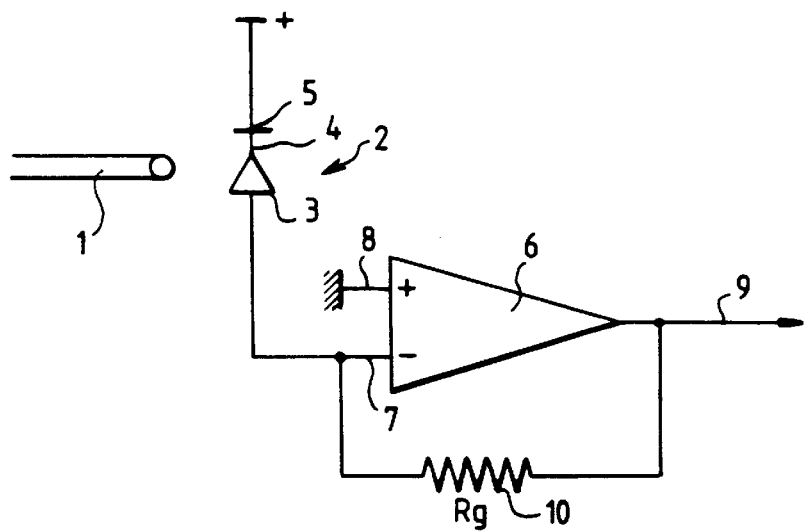
Figure 2:
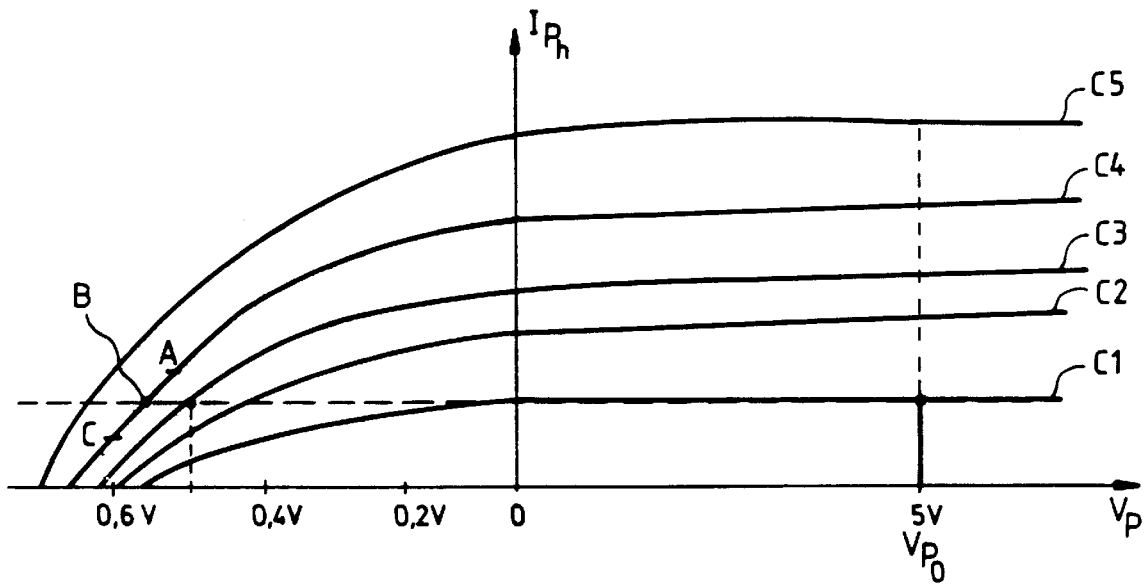
FIG. 2 represents an array of curves C1 to C5, each curve representing, for a constant received light power, the value of the photodetected current $I_{ph}$ as a function of the bias voltage applied to a PIN photodiode.

The operating point of the PIN photodiode 2 is always defined by the bias voltage $V_{po}$. If, as shown intentionally in FIG. 4, the peak photodetection power $P_h$ momentarily goes above the threshold power $P_h$threshold, this means that the instantaneous current $I_{ph}$ is momentarily greater than $I_{av}$. Since the difference $I_{av}$–$I_{ph}$ becomes negative, this means that the capacitor 12 will discharge. The value of the voltage at the point A will fall and turn off the diode 15. If the time during which $I_{ph}$ is greater than $I_{av}$ is sufficiently short, the voltage drop will be slight and this will not affect the operation of the PIN photodiode 2, insofar as over a wide range around $V_{po}$, as shown in FIG. 2, the curves C1 to C5, which give the value of the photodetected current as a function of the bias and are parameterized by the value of the photodetected current, may be likened to straight lines parallel to the abscissa axis.

Whatever the bias point around a value close to $V_{po}$, the response of the PIN photodiode 2, that is to say the value of the current $I_{ph}$, is the same and depends only on the value of the received light power.

When the photodetected power falls back below the threshold power $P_h$threshold, the value of the current $I_{av}$–$I_{ph}$ becomes positive again and the capacitor 12 will benefit from a charging current. The voltage at the point A will increase until the diode 15 is turned on. Thus, when the average value of the photodetected current remains below that of the current delivered by the constant-current generator 11, the PIN photodiode 2 remains reverse-biased. Photodetected currents momentarily greater than the current delivered by the constant-current generator 11 do not affect the behaviour of the PIN photodiode 2.

It will now be explained how the biasing device according to the invention behaves when the average incident light power remains above the threshold power $P_h$threshold. The constant-current generator 11 delivers the same current as in the previous case. This current depends only on the characteristics of the transimpedance preamplifier stage 6.

Let us assume that the reception of the detected signal has started after the device according to the invention has been switched on. As explained previously, at the end of a transient phase the voltage at the point A is such that the diode 15 is conducting. The PIN photodiode 2 is reverse-biased at the value $V_{po}$.

Each time that the value of the current delivered by the PIN photodiode 2 goes above the current $I_{av}$ delivered by the constant-current generator 11, the capacitor 12 discharges with a discharge current $I_{ph}$–$I_{av}$. The potential at A will decrease and the diode 15 will be turned off. Unlike the previous case, the periods of recharging of the capacitor 12 and the values of the recharging current corresponding to the periods in which the photodetected power is below the threshold power $P_h$threshold will be insufficient to recharge the capacitor 12. Let us assume, as shown in FIG. 5, that the photodetected current is on average greater than the current delivered by the constant-current generator 11. As a result, the capacitor 12 will regularly discharge and even charge in such a way that the voltage at the point A will become negative. The PIN photodiode 2 will be forward-biased. The value of the photodetected current delivered by the PIN photodiode 2 when it is forward-biased is shown in the left-hand part of FIG. 2. The scale of the abscissae over this left-hand part is greater than that of the right-hand part so as to make the curves C1 to C5 more discernible.

Thus, when the average value of the photodetected current tends to remain above the programmed current $I_{av}$, the PIN photodiode 2 is forward-biased. The average value of the photodetected current stabilizes at the programmed value $I_{av}$. Such a stabilization is due to the following phenomenon: because of the voltage drop between anode 3 and cathode 5 of the PIN photodiode 2, the electric field in the intrinsic region 4 of the PIN photodiode 2 becomes low and insufficient to ensure good separation of the electron/positive-hole pairs. There is therefore some recombination of the electron/positive-hole pairs liberated in the intrinsic region 4 due to the effect of the incident photons. An equilibrium state is established between the value of the forward-bias voltage resulting from the discharge of the capacitor 12 and the degree of recombination of the electron/positive-hole pairs. The equilibrium state is such that the average value of the photodetected current stabilizes at the value of the current $I_{av}$ delivered by the constant-current generator 11. This operating point shifts along a straight line parallel to the abscissa axis. This straight line is shown in the left-hand part of FIG. 2.

Because of the presence of the capacitor 12, the sensitivity obtained for a certain average light power value remains decoupled from the value of the instantaneous sensitivity.

Thus, although the operating point is determined by the average value of the incident power, the instantaneous operating point shifts along the curve C corresponding to this point. Thus, in FIG. 2, if it is assumed that the operating point is established on the curve C4 at the point B, the intersection of the curve C4 and the straight line $I_{ph}=I_{av}$, the instantaneous operating point of the PIN photodiode 2 shifts along the curve C4, for example between the points C and A. The slow and small shifts in the operating point B about its equilibrium position, due to the slow variations in the voltage of the capacitor 12, do not appreciably affect the instantaneous sensitivity. This is due to the fact that, for small shifts of B, the curves C may be regarded, locally, as being parallel.

Thus, it may be seen that using simple means the operating point of the PIN photodiode 2 is automatically shifted. In a first case, which corresponds to an average incident optical power below an adjustable threshold value $P_h$threshold, the PIN photodiode 2 is reverse-biased and operates in the known way. In a second case, which corresponds to an average incident optical power above this threshold value $P_h$threshold, the PIN photodiode 2 is forward-biased. The reverse or forward biasing is established automatically, depending on the average incident power.

In forward-bias mode, the solution according to the invention confers—above a certain incident optical power $P_h$threshold—on the PIN photodiode 2 a sensitivity which is inversely proportional to the value of the incident optical power P. Thus, above this power, the value of the photodetected current is independent of the value of the average incident optical power.

The biasing means described in relation to FIG. 3 have the advantage of simplicity. Those skilled in the art may, however, readily find other means for shifting the operating point depending on the average incident power received by the PIN photodiode 2.

First of all, obviously, these same means may be applied to the anode 3, and not to the cathode 5, of the PIN photodiode 2. Such a case is shown in FIG. 6.

Figure 6:
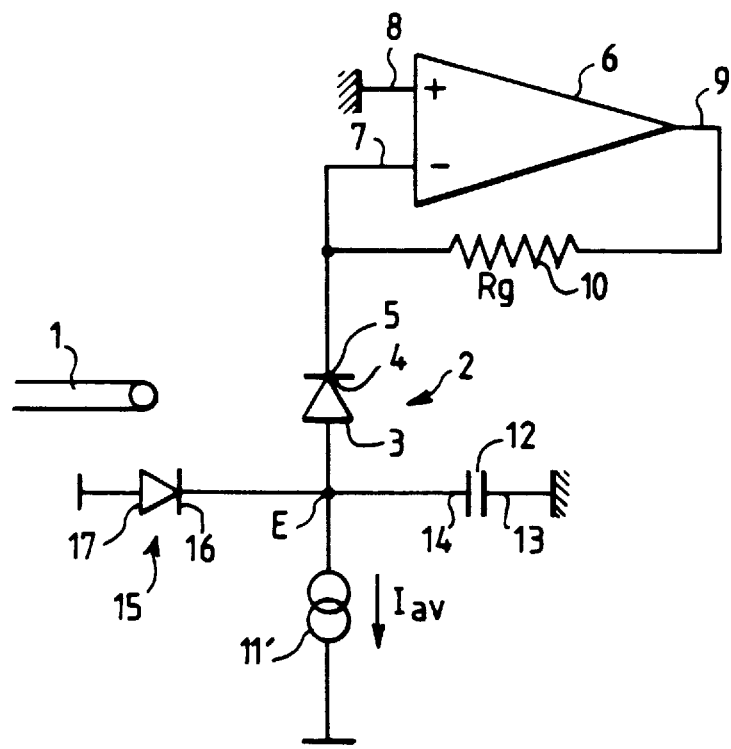
FIG. 6 represents the same biasing means as those in FIG. 3, but connected in an equivalent reverse mode.

This figure shows the same elements as those in FIG. 3, but in the case of FIG. 6, the means for biasing the PIN photodiode 2 are connected at a point E which is connected to the anode 3 of the PIN photodiode 2. In this connection mode, it is the cathode 16 of the biasing diode 15 which is connected to the point E. In this case, the current generated by the constant-current generator 11 flows from the point E to the constant-current generator 11. The operation is the same as in the previous case.

In another embodiment, not shown, the biasing diode 15 could be replaced by a transistor having its base connected to the point E.

Finally, those skilled in the art may conceive of other biasing means, these means being connected in a parallel way to the PIN photodiode 2 and being then connected to one and the other of the electrodes of this PIN photodiode 2.

What is claimed as new and is desired to be secured by Letters Patent of the United States is:

1. A detection device that detects a modulated light wave comprising:

a PIN photodiode comprising,
        a first electrode,
        a second electrode,
        an anode,
        a cathode, and
        an intrinsic part, said PIN photodiode configured to deliver a photodetection current i(t) proportional to a power of the modulated light wave when incident thereon and when reverse-biased by a positive voltage applied between said cathode and said anode, and configured to deliver a constant average photodetection current when forward-biased; and means for automatically biasing the PIN photodiode in either a forward bias state or a reverse bias state depending on an average received power of said modulated light wave incident on said PIN photodiode, said means for automatically biasing being connected to at least one of said first electrode and said second electrode of said PIN photodiode having
        means for reverse-biasing said PIN photodiode when the average received power is below a threshold value, and
        means for forward-biasing said PIN photodiode when said average received power is greater than the threshold value.

2. The device of claim 1, wherein said means for automatically biasing comprises:

a biasing diode comprising,
        two biasing diode electrodes, one of which is connected to at least one of the first electrode and the second electrode of the PIN photodiode,
        a biasing diode anode, and
        a biasing diode cathode;

a capacitor connected to at least one of the first electrode and the second electrode of the PIN photodiode; and a constant current generator connected to at least one of the first electrode and the second electrode of the PIN photodiode.

3. The device of claim 2, wherein said biasing diode anode, said capacitor and the constant current generator are connected to said cathode of said PIN photodiode.

4. The device of claim 2, wherein said biasing diode cathode, said capacitor and the constant current generator are connected to said anode of said PIN photodiode.

* * * * *